US006437386B1

(12) United States Patent
Hurst et al.

(10) Patent No.: US 6,437,386 B1
(45) Date of Patent: Aug. 20, 2002

(54) METHOD FOR CREATING THICK OXIDE ON THE BOTTOM SURFACE OF A TRENCH STRUCTURE IN SILICON

(75) Inventors: Henry W. Hurst, Orem; James J. Murphy, South Jordon, both of UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/640,954

(22) Filed: Aug. 16, 2000

(51) Int. Cl.$^7$ .............................................. H01L 27/108
(52) U.S. Cl. ...................... 257/301; 438/243; 438/386
(58) Field of Search .......................... 257/301; 438/243, 438/386

(56) References Cited

U.S. PATENT DOCUMENTS

| | | | |
|---|---|---|---|
| 4,914,058 A | | 4/1990 | Blanchard |
| 4,941,026 A | | 7/1990 | Temple |
| 4,967,245 A | | 10/1990 | Cogan et al. |
| 4,992,390 A | | 2/1991 | Hsueh-Rong Chang ..... 438/270 |
| 5,126,807 A | * | 6/1992 | Baba et al. .................. 257/401 |
| 5,164,325 A | | 11/1992 | Cogan et al. |
| 5,242,845 A | * | 9/1993 | Baba et al. .................. 438/243 |
| 5,298,781 A | | 3/1994 | Cogan et al. |
| 5,770,878 A | | 6/1998 | Beasom |
| 5,801,417 A | | 9/1998 | Tsang et al. ................. 257/333 |
| 5,879,994 A | | 3/1999 | Kwan et al. ................. 438/268 |
| 5,998,833 A | * | 12/1999 | Baliga ......................... 257/329 |
| 6,262,453 B1 | * | 7/2001 | Hshieh ......................... 257/341 |

FOREIGN PATENT DOCUMENTS

JP 01192174 A * 8/1989 ................ 257/331

OTHER PUBLICATIONS

Technical Literature from Applied Materials, Farhad Moghadam, Delivering Value Around New Industry Paradigms, pp. 1–11, vol. 1, Issue 2, Nov. 1999.
Technical Literature from Quester Technology, Model APT–4300 300mm Atmospheric TEOS/Ozone CVD System.
Technical Literature from Quester Technology, Model APT–6000 Atmospheric TEOS–Ozone CVD System.
Technical Literature from Semiconductor Fabtech, Curtis, et al, APCVD TEOS: O3 Advanced Trench Isolation Applications, 9th Edition.
Technical Literature from Semiconductor International, John Baliga, Options for CVD of Dielectrics Include Low–k Materials, Jun. 1998.
Technical Literature from Silicon Valley Group Thermal Systems, APNext, High Throughput APCVD Cluster Tool for 200 mm/300 mm Wafer Processing.

* cited by examiner

*Primary Examiner*—Nathan J. Flynn
*Assistant Examiner*—Scott R. Wilson
(74) *Attorney, Agent, or Firm*—Babak S. Sani; Townsend and Townsend and Crew LLP

(57) ABSTRACT

A gate isolation structure of a semiconductor device and method of making the same provides a trench in a silicon substrate, wherein a dielectric layer is formed on sidewalls and bottom of the trench, the dielectric layer having a first thickness on the sidewalls and a second thickness at the bottom that is greater than the first thickness. The thicker dielectric layer at the bottom substantially reduces gate charge to reduce the Miller Capacitance effect, thereby increasing the efficiency of the semiconductor device and prolonging its life.

6 Claims, 9 Drawing Sheets

METHOD FOR CREATING THICK OXIDE ON THE BOTTOM SURFACE OF A TRENCH STRUCTURE IN SILICON

CROSS REFERENCES TO RELATED APPLICATIONS

A first related application, filed concurrently with the present application, is U.S. patent application Ser. No. 09/640,955, in the names of Izak Bencuya et al. and entitled "Vertical MOSFET with Ultra-Low Resistance and Low Gate Charge" and assigned to the present assignee. A second related application, filed concurrently with the present application, is U.S. patent application Ser. No. 09/640,496, in the name of James J. Murphy, and entitled "Selective Oxide Deposition in the Bottom of a Trench" and assigned to the present assignee. Both of these applications are incorporated by reference herein for all purposes.

BACKGROUND OF THE INVENTION

The present invention relates in general to field effect transistors, and in particular to trench transistors and methods of their manufacture.

FIG. 1 is a simplified cross section of a portion of a conventional trench power metal-oxide-semiconductor field-effect transistor (MOSFET). A trench 10 has sidewalls 11 and bottom 17, and is lined with an electrically insulating material 12 that acts as a gate dielectric, and is filled with a conductive material 15, such as polysilicon, which forms the gate of the transistor. The trench, and hence the gate, extend from the surface of the silicon into the substrate down through a body region 22 and a drain region 16. In the example shown in FIG. 1, the body region 22 is a P-type region and the drain region 16 is an N-type region. Drain region 16 may be electrically contacted through the substrate of the device. N-type regions 14 adjacent to and on opposite sides of the trench 10 form the source electrode 18 of the transistor. An active channel region 20 is thus formed alongside of the trench between the N-type regions 14 of the source electrode 18 and the drain region 16.

An important parameter in a trench power MOSFET is the total gate charge. In some applications of conventional trench power MOSFETs, such as DC-DC converters, the lower the gate charge the better the efficiency of the overall design. One major component of the total gate charge is the charge required to supply what is known as the Miller capacitance, which is a parasitic capacitance that forms between the gate and the drain. The Miller capacitance is an effective increase of gate to drain capacitance effect due to a rising drain current in the MOSFET active state. As a result, a higher proportion of the total gate charge flows through the gate-drain capacitance, and the rate of the rise of the gate to drain voltage is reduced, causing negative feedback from the drain circuit to the gate circuit. Thus, an effective way to lower the gate charge is to reduce the Miller Capacitance. One method to decrease the Miller Capacitance is to increase the thickness of the gate dielectric. However a uniformly thicker gate dielectric layer requires higher gate charge which results in lower efficiency.

SUMMARY OF THE INVENTION

The present invention provides a trench metal oxide semiconductor field effect transistor (MOSFET) having a dielectric layer that is thicker in the bottom of the trench as compared to the dielectric layer on the sidewalls of the trench where the transistor channel is formed.

Accordingly, in one embodiment, the present invention provides for self-aligned local oxidation of silicon (LOCOS) in the bottom of a trench structure to produce a gate isolation structure including a dielectric layer formed on sidewalls and bottom of the trench, where the dielectric layer has a first thickness on the sidewalls and a second thickness on the bottom that is greater than the first thickness.

In another embodiment, the invention provides a trench field effect transistor formed on a silicon substrate, the trench transistor including a trench in a silicon substrate, a dielectric layer formed on sidewalls and bottom of the trench, the dielectric layer having a first thickness on the sidewalls and a second thickness on the bottom that is greater than the first thickness, and a gate conductive material substantially filling the trench.

In yet another embodiment, the invention provides a method of forming a gate dielectric layer of a trench field effect transistor including the steps of forming a trench extending into a silicon substrate, forming a first layer of a dielectric material along sidewalls and bottom of the trench, and forming a second layer of the dielectric material at the bottom of the trench, whereby, the bottom of the trench is lined with dielectric material with a greater thickness than the sidewalls of the trench. In an embodiment, the dielectric layer is formed with a self-aligned LOCOS process tuned to the specific geometries (trench depth, aspect ratio of sidewalls, etc) of the trench in the silicon substrate. In an alternative embodiment, the dielectric layer is formed with a hard mask provided over the silicon substrate proximate the trench.

The following detailed description and the accompanying drawings provide a better understanding of the nature and advantages of the trench transistor with a thick oxide at the bottom surface of the trench.

DESCRIPTION OF THE SPECIFIC EMBODIMENTS

Figure 1:
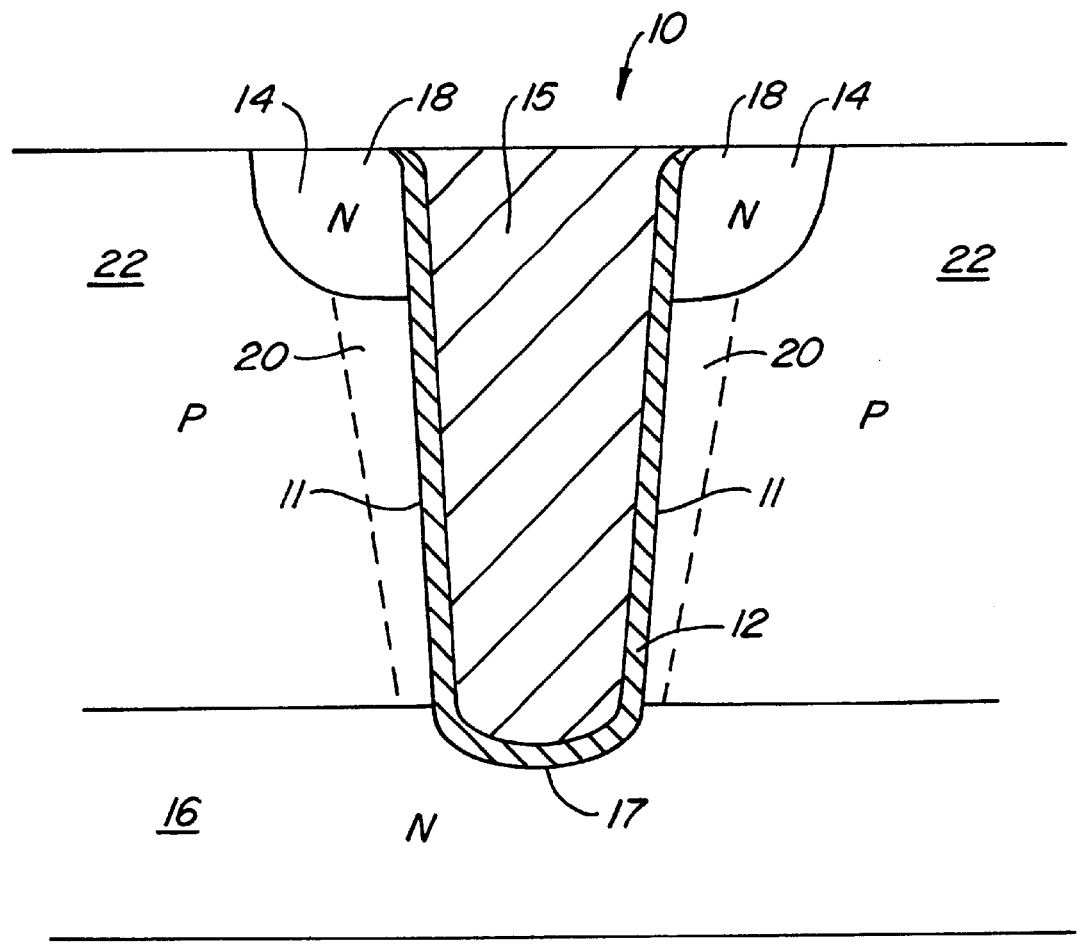
FIG. 1 is a simplified cross section of an exemplary conventional trench transistor.
Figure 2:
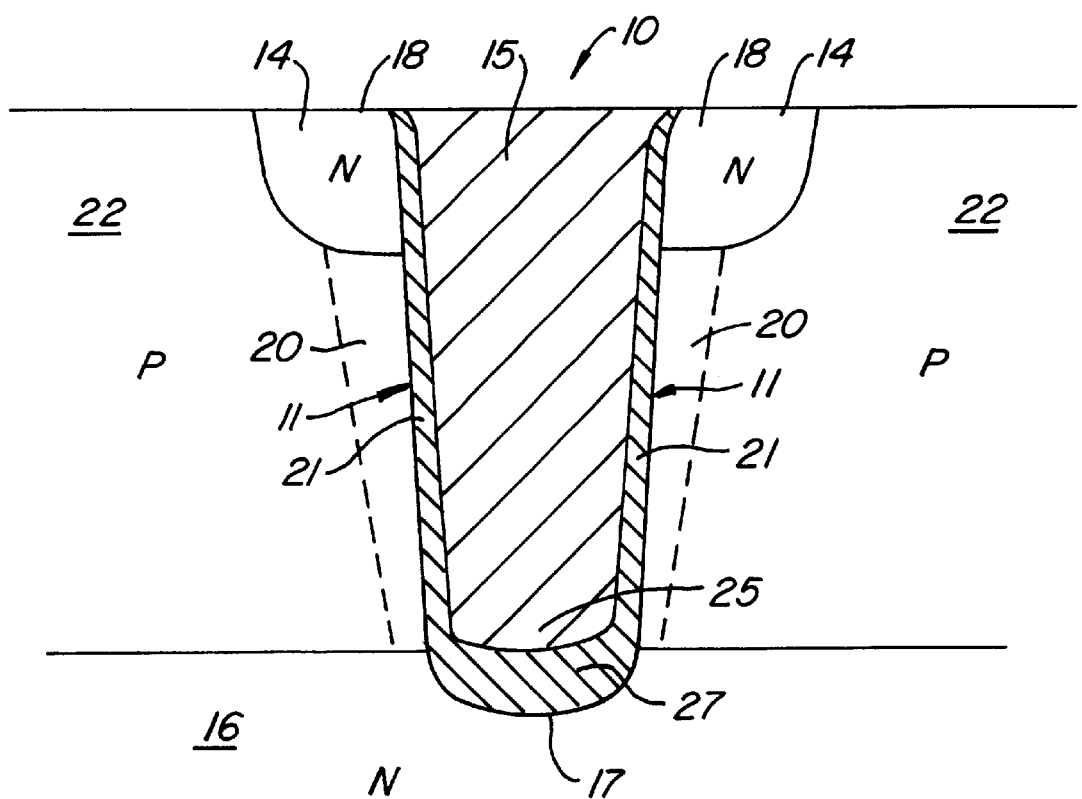
FIG. 2 is a simplified cross section of trench transistor according to an embodiment of the present invention.

FIG. 2 illustrates an exemplary n-type trench transistor with a superior gate isolation structure according to an embodiment of the present invention. A trench 10 with sidewalls 11 and a bottom 17 extends into a silicon substrate body region 22. The source electrode is shown in FIG. 2 as being two N-type regions 14 adjacent to and on opposite sides of the trench 10. The drain electrode is shown as an N-type region 16 below a P-type body region 22. It is to be understood that in the case of a p-type transistor, the conductivity type of each of the drain, source and body regions may be reversed. A conductive material forms the gate 15 of the trench transistor. The gate 15 may extend above, below, or at the level of the top surface of the silicon substrate body region 22. In operation, drain region 16 may be electrically contacted through the substrate of the device, the gate 15 may be electrically contacted via a conductive layer (e.g., aluminum) above the transistor (not shown), and an active channel region 20 will form alongside the trench between the source 18 and the drain 16.

In a preferred embodiment, the gate dielectric layer 21 has a substantially uniform thickness at the sidewalls of the trench, with a bottom layer 27 having a thickness that is greater than the side layer 21. Because in trench MOSFETs the gate-to-drain Miller Capacitance is formed at the bottom of the trench, a thicker dielectric layer on the bottom of the trench directly reduces the gate-to-drain Miller Capacitance and thus the total gate charge. The thinner dielectric layer along the sidewalls of the trench ensures that the overall efficiency and performance of the trench MOSFET is not degraded.

The trench MOSFET with variable gate dielectric thickness according to this embodiment of the invention provides a number of other advantages. With a thicker isolation layer at the bottom, the electric field across the dielectric material at the bottom of the trench is reduced. The reduced electric field in turn reduces stress on the dielectric layer. Etch defects in the bottom of the trench can be isolated more effectively by a thicker isolation layer at the bottom of the trench. Further, effects of a higher electric field at the rounded corners at the bottom of the trench are offset by a thicker dielectric layer at the bottom of the trench.

Figure 3:
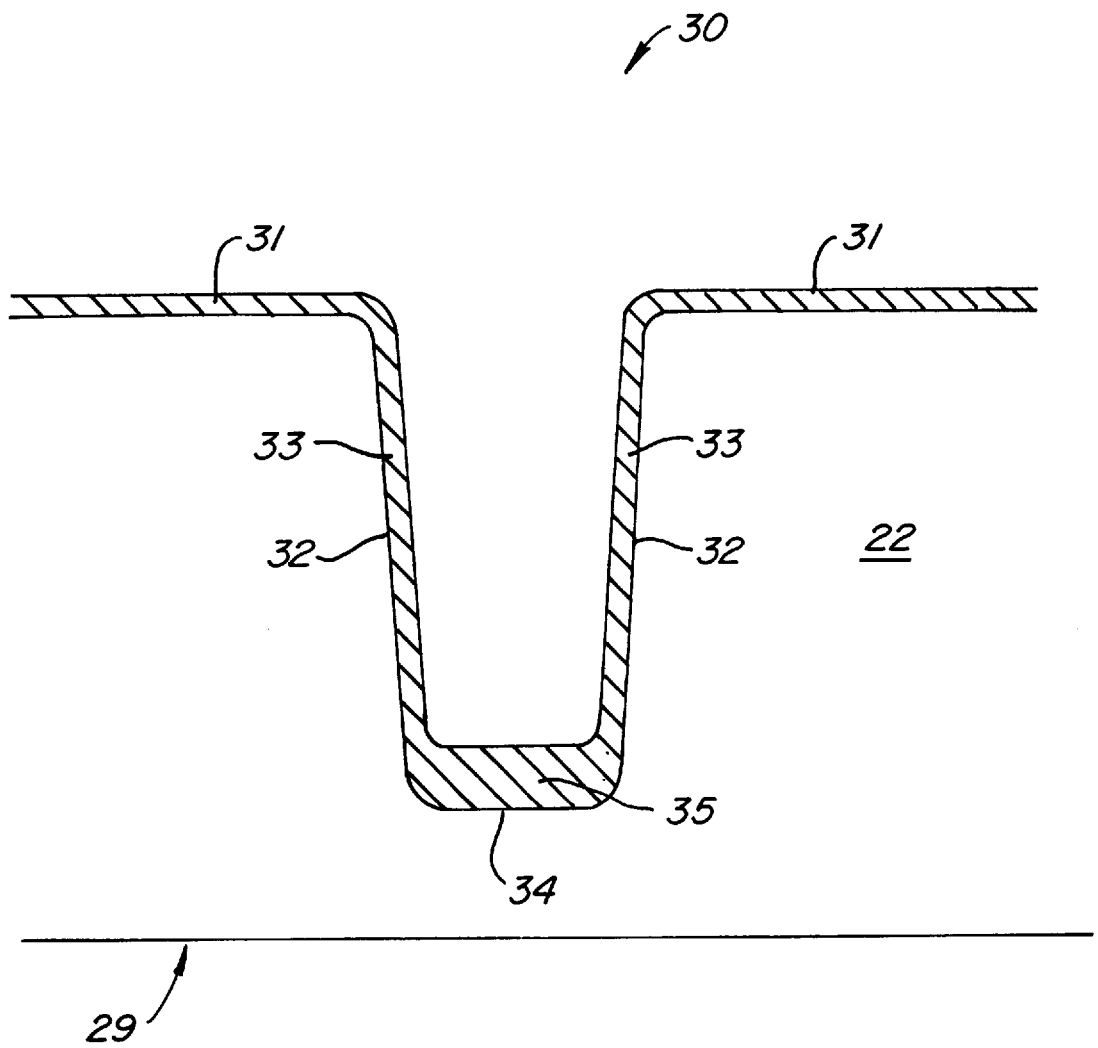
FIG. 3 is a simplified cross section of a thermal oxide layer on a portion of a silicon wafer having a trench structure therein, according to an embodiment of the invention.

FIG. 3 illustrates a dielectric layer 31, 33 and 35 on a trench structure 30 in a semiconductor substrate 29, according to an embodiment of the present invention. In one embodiment, the dielectric layer is thermally grown silicon dioxide $SiO_2$. The trench structure 30 is formed in a body portion 22 of a substrate 29. The trench 30 has two sidewalls 32 and a bottom 34. The bottom may be squared with the sidewalls, or may be rounded, depending upon the formation process of the trench employed.

The dielectric (or oxide) layer 31, 33 and 35 is formed on the trench 30 and on top of the body portion 22 of the substrate 29. The oxide layer 31 on top of the body portion and the oxide layer 33 on the sidewalls of the trench preferably have a thickness that is substantially uniform. The thickness of the sidewall oxide may be for example 300 Å. The oxide layer 35 at the bottom of the trench has a thickness that is greater than the side oxide layer 33 thickness. The bottom layer of oxide may have an exemplary thickness of 1100 Å.

As has been discussed, forming a gate dielectric layer on a trench structure of a trench MOSFET presents challenges that are not present when forming a dielectric layer on a planar surface. Gate oxide grows faster on a flat surface than at a comer, such as exists at the bottom of the trench structure. The gate oxide that forms the gate dielectric layer is also more susceptible to etching defects within the trench. Therefore, it is also desirable for a method of manufacturing a thick dielectric layer at the bottom of the trench that avoids or alleviates the above difficulties.

Figure 4:
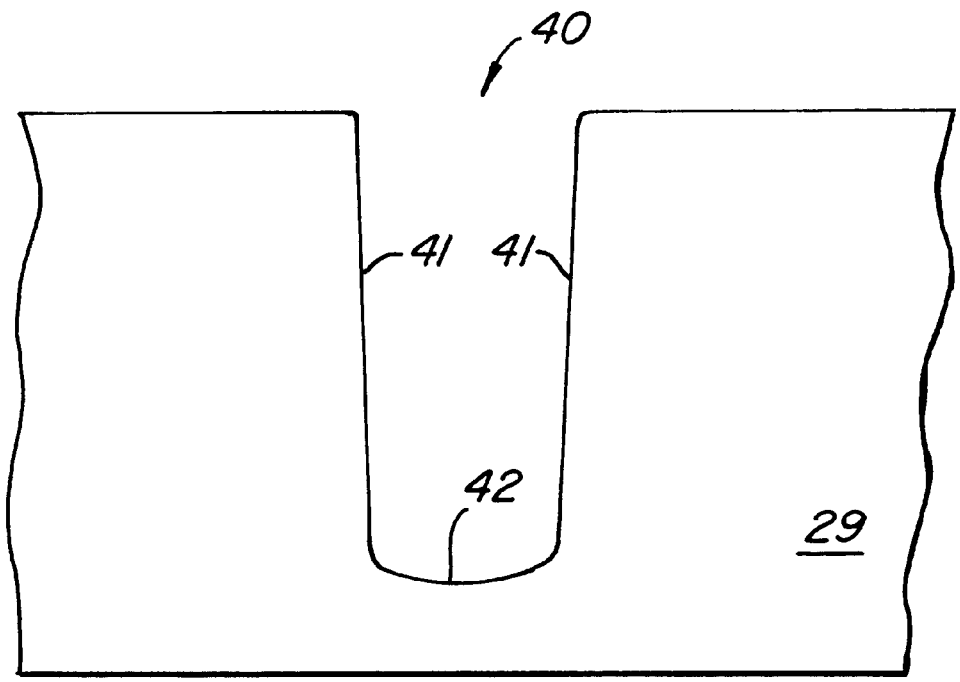
FIGS. 4 through 9 illustrate a process of forming a gate isolation layer of a trench field effect transistor according to the invention.
Figure 5:
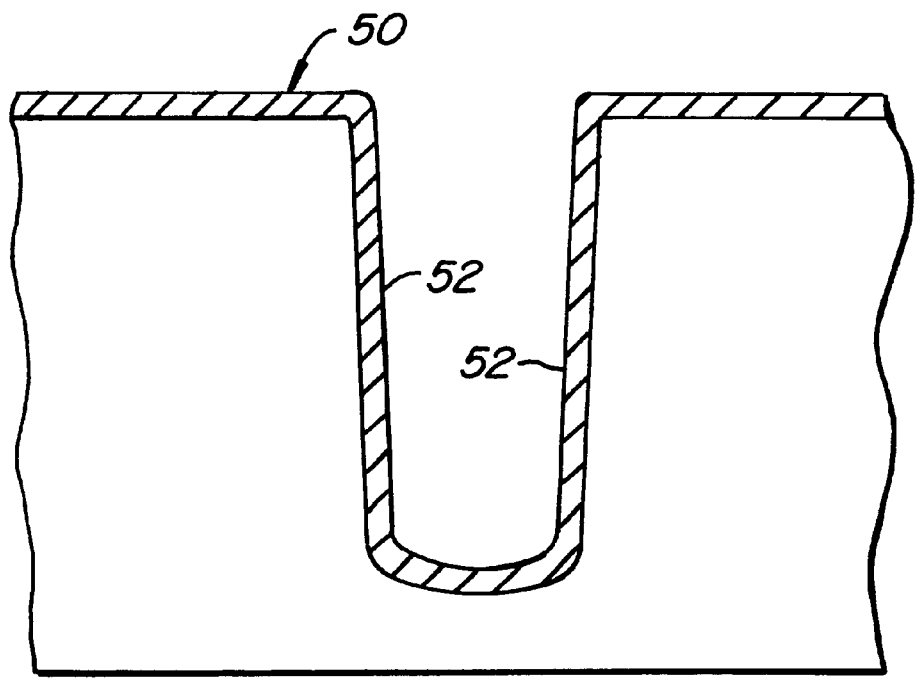

FIGS. 4 through 9 illustrate one example of a method for forming a gate dielectric layer according to the present invention. With reference to FIG. 4, a trench structure 40 is defined in silicon on a substrate 29. The trench has a bottom 42 and two sidewalls 41. Next, the trench is subjected to an oxidation process, whereby a conformal layer of oxide 50 is formed over the shape of the trench structure as illustrated by FIG. 5. Formation of the oxide film is preferably performed by a process of thermal oxidation. In a preferred exemplary embodiment, oxide 50 is a "pad oxide" grown on the exposed silicon surfaces in and around the trench, to a depth of between 200–1000 Å.

Figure 6:
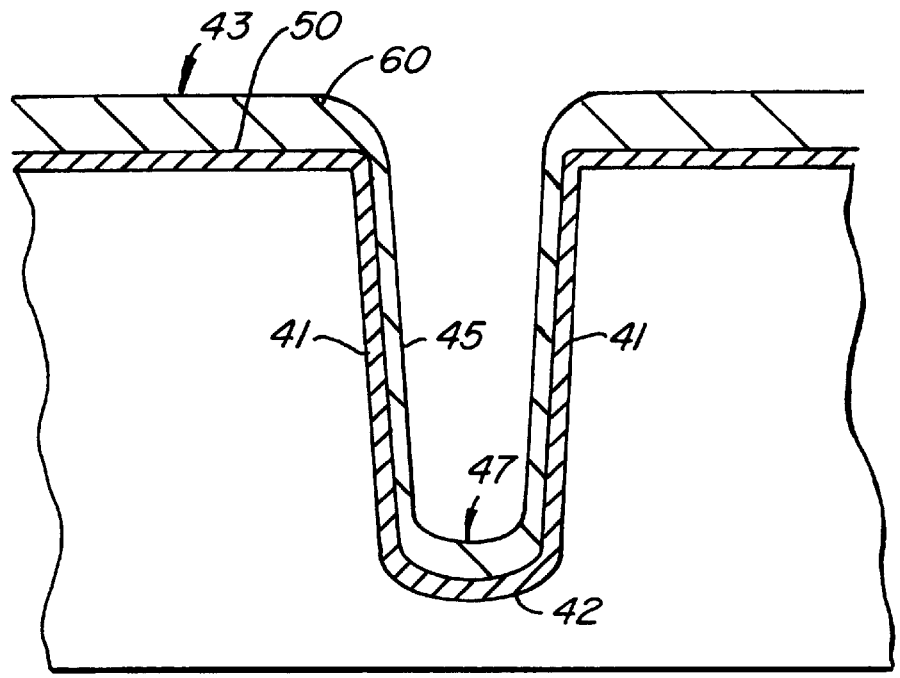

With reference to FIG. 6, a layer of an oxidation barrier 60 is next deposited on the conformal layer of oxide 50. The thickness of the pad oxide in FIG. 5 determines the amount of encroachment of growth under the edges of the oxidation barrier layer 60. Silicon nitride is used for the oxidation barrier in a preferred embodiment, however other materials exhibiting similar oxidation inhibiting properties may also be suitably employed. In a preferred method, silicon nitride is deposited over the pad oxide using a plasma enhanced chemical vapor deposition (PECVD) process. The precise characteristics of the oxidation barrier layer 60 may be varied by changes to gas ratios, temperature, pressure, and spacing of components in a CVD chamber, all of which may be tuned for specific applications of the trench structure. The PECVD process is also tuned to the specific geometries of the trench, such as depth or aspect ratio of the sidewalls. The process creates a non-uniform thickness for oxidation barrier layer 60: a thickest layer 43 on the top surface; a thinnest layer 45 on sidewalls 41; and an intermediate thickness layer 47 on the bottom 42 of the trench. Preferably, reaction depletion of the silicon nitride is used to accomplish the non-uniform thickness of the oxidation barrier layer 60, which is one key to self alignment of the LOCOS process discussed below.

Figure 7:
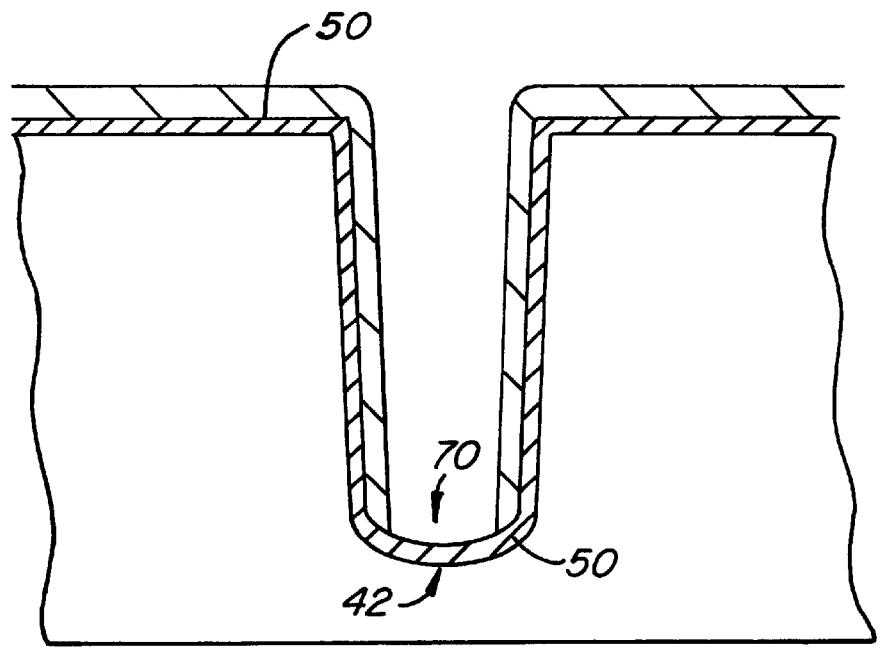

Next, referring to FIG. 7, a portion 70 of the oxidation barrier layer 60 is removed in the bottom 42 of the trench structure above the oxide 50. In an embodiment of the present invention, the portion 70 of silicon nitride is removed using a highly directional anisotropic etchback process, leaving a layer of silicon nitride on the sidewalls 41 of the trench structure. The thickest layer 43 and intermediate thickness layer 47 at the respective top and the bottom 42 shown in FIG. 6 etch at approximately the same rate. The thinnest layer 45 on the sidewalls 41 etch very little. Etch times may be adjusted in order to completely remove the oxidation barrier layer 60 from the bottom 42 of the trench and leave all other surfaces covered. In alternative embodiments, the etchback process is possible using a variety of etchant materials and etch environments. Etch variables such as temperature, pressure and RF power of the etching process may be tuned to accomplish the anisotropic etch process.

In an alternative embodiment, a combination of different nitride films can allow for removal of some of the sidewall nitride near the bottom of the trench, where nitride coverage is thinnest. By using a short isotropic etch step at the end of the etchback process, the nitride film near the bottom of the trench can be targeted and removed, thereby increasing the area that can be oxidized according to other steps of the invention.

Figure 8:
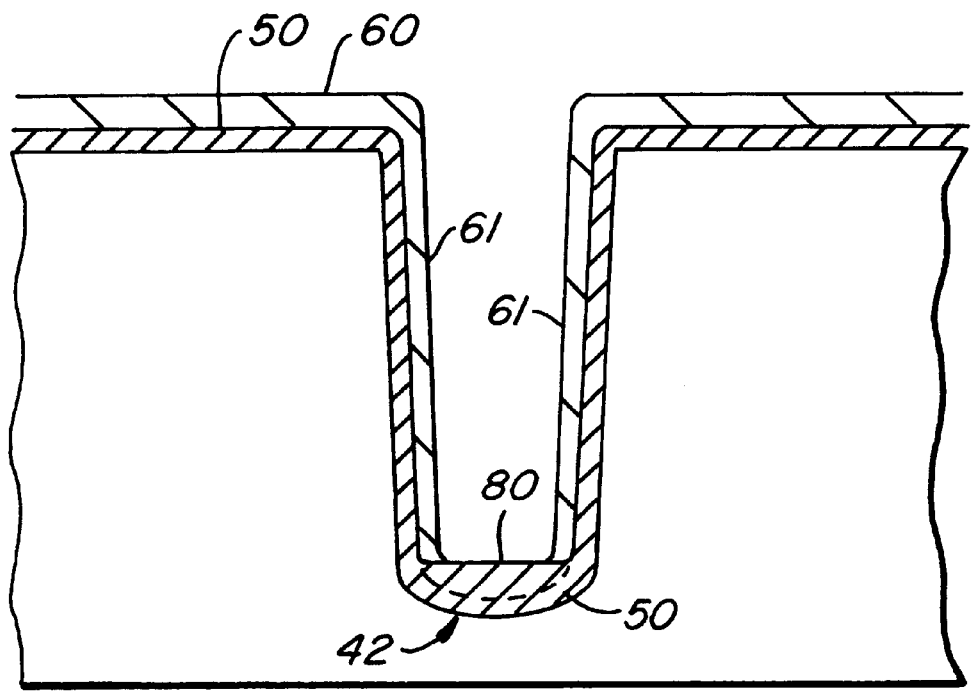

Next, with reference to FIG. 8, a second layer of oxide 80 is formed using local oxidation of silicon (LOCOS) oxidation techniques in the exposed bottom area of the trench 42 on top of the already existing layer 50 provided in FIG. 5. The oxidation barrier layer 60 that has not been etched back, and which covers the remaining surfaces of the trench, inhibits further oxidation of the sidewalls 41 and top of the silicon. The second layer of oxide 80 on the bottom of the trench 42 results in a thicker bottom oxide layer than the sidewalls of the trench 41. Preferably, the second layer of oxide is provided in an oxidation process in the temperature range of, for example, 800–1250 degrees Celsius. The process can be either a "wet" or "dry" oxidation, as each is well known to persons of skill in the art.

Figure 9:
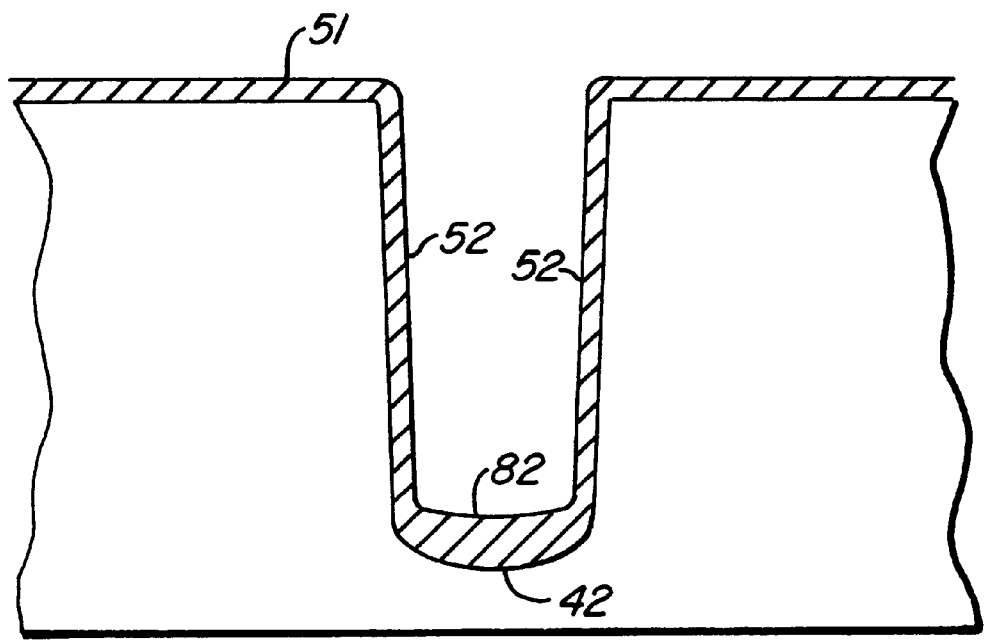

Referring now to FIG. 9, a last step in forming a bottom surface of a power MOSFET trench structure according to the present invention is illustrated. The remaining portions of the oxidation barrier layer 60 shown in FIG. 8 are removed as illustrated in FIG. 9. In a preferred embodiment, silicon nitride comprising the remaining oxidation barrier layer 60 is removed using a selective etch process, such as a hot phosphoric acid bath, which removes very little of the grown oxides 51, 52, and 82. Thus, shown in FIG. 9 is the result where the bottom 42 of the trench structure has a thickness that is greater than a thickness of the oxide layers 52 on the sidewalls of the trench structure and the top surface.

Figure 10:
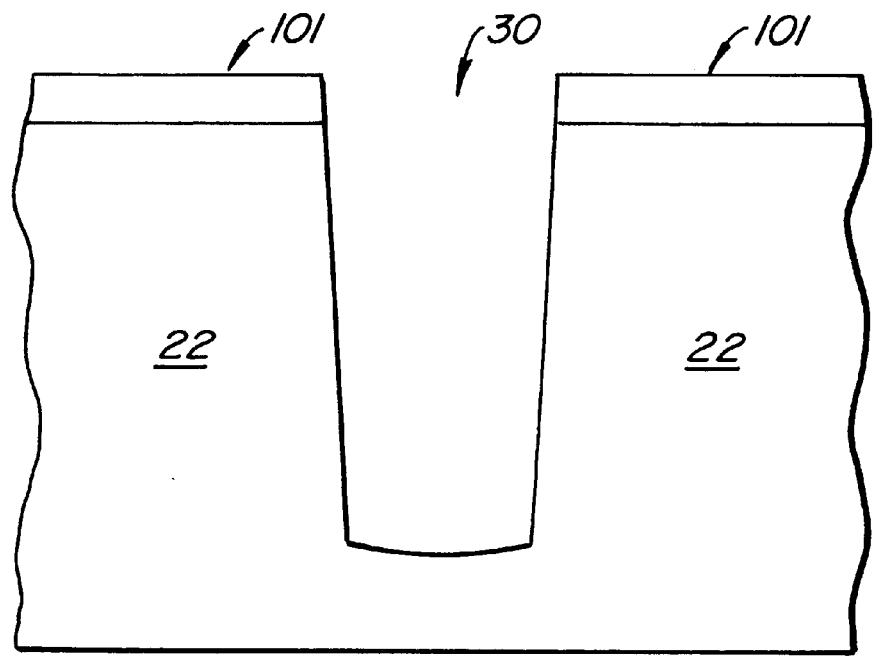
FIGS. 10 through 15 illustrate an alternative process of forming a gate isolation layer of a trench field effect transistor according to the invention.

FIGS. 10 through 13 illustrate an alternative process to that shown in FIGS. 5–8 of forming a gate isolation layer according to the invention. In an alternative method, a "hard mask" is used after etching a trench 30 in a silicon substrate body region 22. Referring now to FIG. 10, a hard mask 101 is patterned on the silicon substrate surface by conventional lithography techniques. The hard mask material is preferably a thermal oxide or nitride, or a deposited oxide or nitride.

Figure 11:
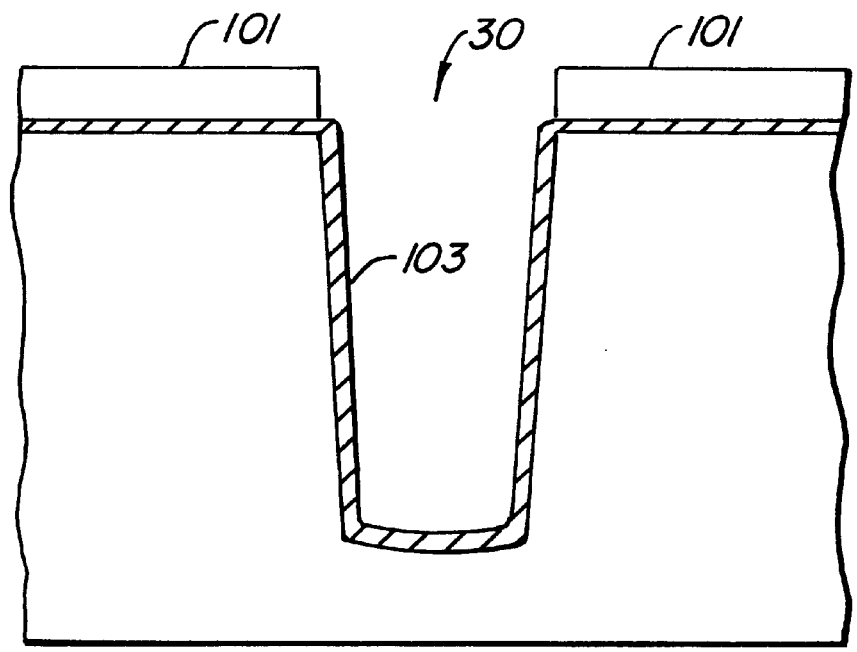
Figure 12:
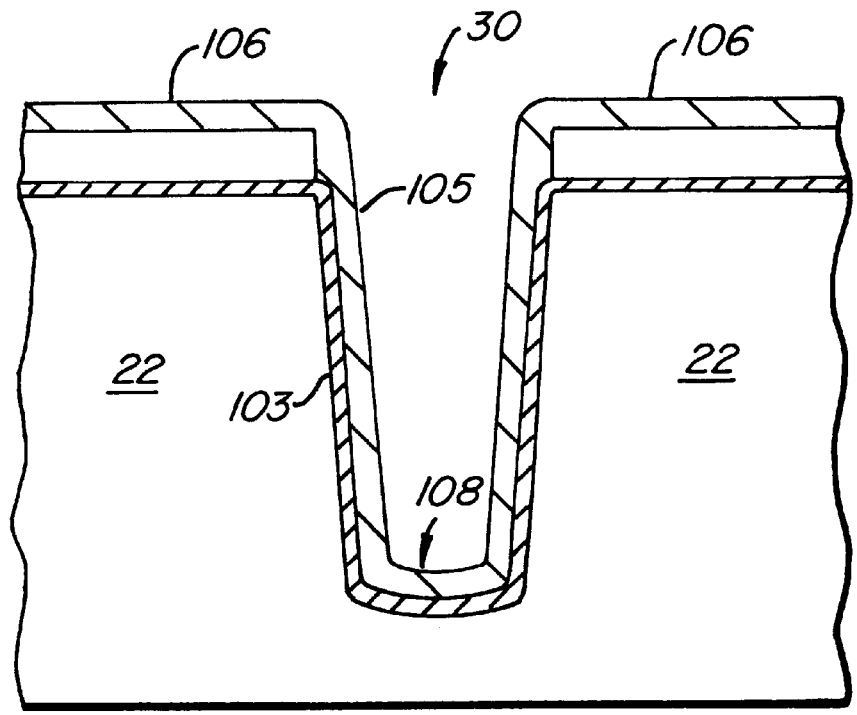

Next, shown in FIG. 11, the trench 30 is subjected to a thermal oxidation process similar to that discussed above, however the oxidation layer 103 under the hard mask is somewhat reduced, and substantially uniform along the bottom and sidewalls of the trench. Then, an oxidation barrier layer 105 is deposited over the hard mask and into the trench. Preferably, the oxidation barrier is silicon nitride, deposited using PECVD as discussed in detail above. Alternatively, an oxidation barrier may be deposited using a low pressure deposition (LPCVD). An LPCVD nitride deposition is more dense than PECVD nitride, and will be deposited more uniformly, where the thickness of layer 105 is substantially equal on all surfaces of the trench 30. While silicon nitride is a preferred oxide barrier, persons of skill in the art would recognize that other materials may be used that exhibit oxidation inhibiting characteristics.

Figure 13:
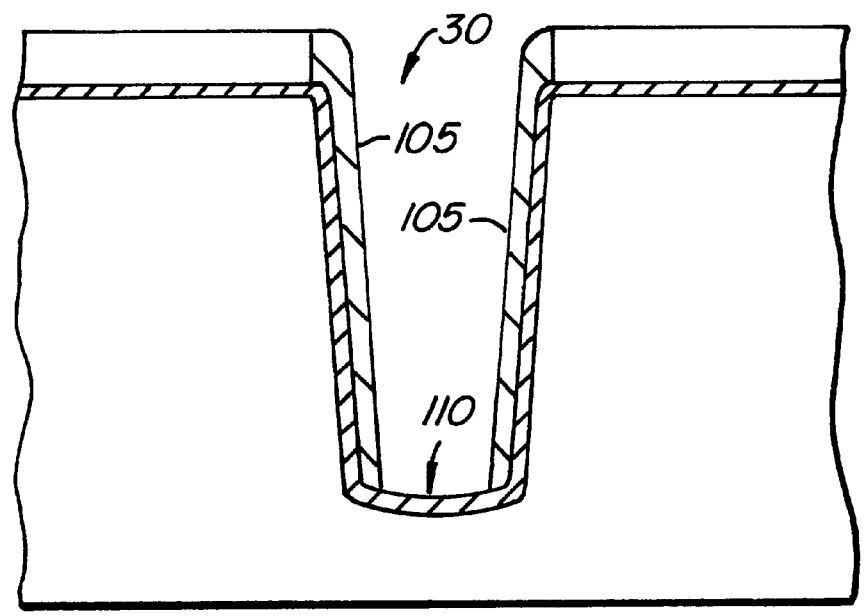

In the event that an LPCVD oxidation barrier was used, isotropic etchback of the conformal oxide barrier layer 105 removes portions of the layer on the silicon surface (106) and the bottom of the trench (108), since the thickness of the top 106 and bottom 108 is substantially the same, yielding an oxidation barrier layer 105 on the trench 30 sidewalls as shown in FIG. 13. It is preferred that the etchback process be selective to oxide in order to prevent removal of the oxidation layer.

Figure 14:
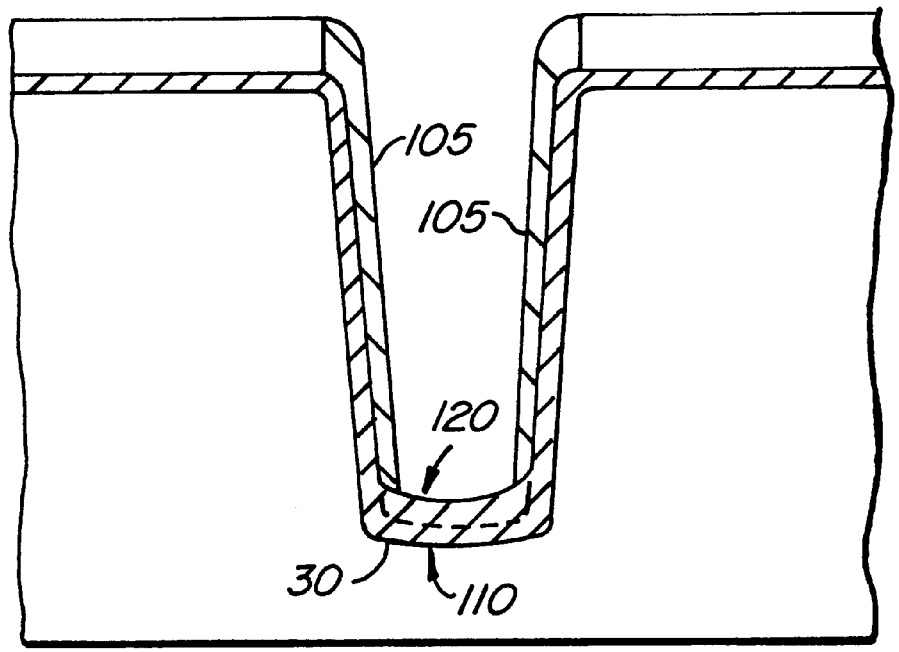

Next, with reference to FIG. 14, a second layer of oxide 120 is formed using LOCOS techniques in the exposed bottom area of the trench 30 on top of the already existing layer 110. The oxidation barrier layer 105 that has not been etched back, and which covers the remaining surfaces of the trench, inhibits further oxidation of the sidewalls and top of the silicon. The second layer of oxide 120 on the bottom of the trench 30 results in a thicker bottom oxide layer than the sidewalls of the trench. Preferably, the second layer of oxide is provided in an oxidation process in the temperature range of, for example, 800–1250 degrees Celsius. The process can be either a "wet" or "dry" oxidation, as each is well known to persons of skill in the art.

Figure 15:
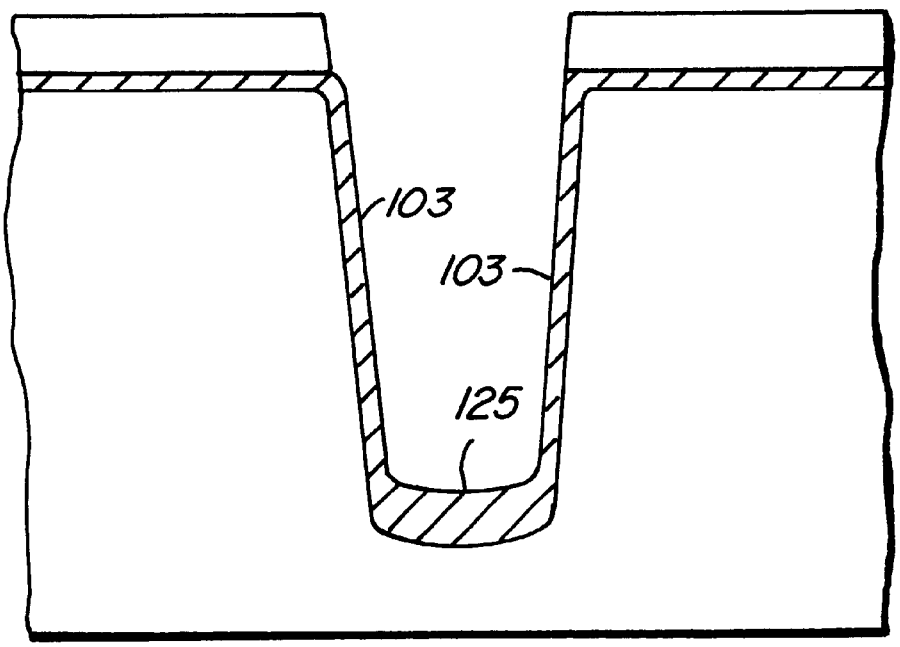

FIG. 15 shows the last step in forming a bottom surface of a power MOSFET trench structure according to the present invention. The remaining portions of the oxidation barrier layer 105 shown in FIG. 14 are removed. In a preferred embodiment, silicon nitride comprising the remaining oxidation barrier layer 105 is removed using a selective etch process, such as a hot phosphoric acid bath, which removes very little of the grown oxides 103 and 125. Thus, shown in FIG. 15 is the result where the bottom 125 of the trench structure has a thickness that is greater than a thickness of the oxide layers 103 on the sidewalls of the trench structure and the top surface.

While the above is a complete description of specific embodiments of the present invention, various modifications, variations, and alternatives may be employed. For example, alternative lithography and deposition processes may produce the same structure. Alternatively, materials exhibiting characteristics sufficient for either pad oxide or oxidation inhibiting layer may be employed according to the method described herein, for producing a gate isolation layer according to the principles of the invention. Therefore, the scope of this invention should not be limited to the embodiments described, and should instead be defined by the following claims.

What is claimed is:

1. A gate isolation structure of a semiconductor device, comprising:

a trench formed in a silicon substrate, said trench defined by sidewalls and a curved, non-flat bottom; and a dielectric layer formed on the sidewalls and bottom of the trench, said dielectric layer having a thickness transition region that smoothly tapers in thickness from a first thickness on the sidewalls of the trench to a second and greater thickness at the bottom of the trench.

2. The structure of claim 1 wherein the dielectric layer further comprises a gate oxide layer.

3. The structure of claim 1 wherein dielectric layer substantially conforms to the bottom of the trench.

4. A trench field affect transistor formed on a silicon substrate, the trench comprising:

a trench formed in a silicon substrate, said trench defined by sidewalls and a curved, non-flat bottom;

a dielectric layer formed on the sidewalls and bottom of the trench, said dielectric layer having a thickness transition region that smoothly tapers in thickness from a first thickness on the sidewalls of the trench to a second and greater thickness at the bottom of the trench; and a gate conductive material substantially filling the trench.

5. The transistor of claim 4 wherein the dielectric layer further comprises a gate oxide layer.

6. The transistor of claim 4 further comprising a pair of doped source regions positioned adjacent to and on opposite sides of the trench forming a source electrode of the field effect transistor, and the substrate forming a drain electrode of the field effect transistor.

* * * * *

UNITED STATES PATENT AND TRADEMARK OFFICE
CERTIFICATE OF CORRECTION

PATENT NO. : 6,437,386 B1
DATED : August 20, 2002
INVENTOR(S) : Hurst et al.

It is certified that error appears in the above-identified patent and that said Letters Patent is hereby corrected as shown below:

Column 6,
Line 39, after "wherein", insert -- the --.
Line 42, after "trench", insert -- transistor --.

Signed and Sealed this

Twenty-first Day of January, 2003

JAMES E. ROGAN
*Director of the United States Patent and Trademark Office*